United States Patent
Lin et al.

(10) Patent No.: US 8,416,025 B2
(45) Date of Patent: Apr. 9, 2013

(54) REFERENCE ASSISTED CONTROL SYSTEM AND METHOD THEREOF

(75) Inventors: Chia-Liang Lin, Fremont, CA (US); Chao-Cheng Lee, Hsinchu (TW)

(73) Assignee: Realtek Semiconductor Corp., Hsinchu (TW)

(*) Notice: Subject to any disclaimer, the term of this patent is extended or adjusted under 35 U.S.C. 154(b) by 154 days.

(21) Appl. No.: 12/759,704

(22) Filed: Apr. 14, 2010

(65) Prior Publication Data

US 2011/0254631 A1    Oct. 20, 2011

(51) Int. Cl.
*H03L 7/087*    (2006.01)
*H03L 7/07*     (2006.01)
*H03L 7/093*    (2006.01)
*H03L 7/22*     (2006.01)

(52) U.S. Cl. .......... 331/2; 331/10; 331/11; 331/17; 331/47; 327/156

(58) Field of Classification Search .......... 331/2, 11, 331/10, 16, 17, 46–56; 327/147, 156; 375/373–376
See application file for complete search history.

(56) References Cited

U.S. PATENT DOCUMENTS

| | | | | |
|---|---|---|---|---|
| 5,446,416 A | * | 8/1995 | Lin et al. | 331/11 |
| 5,943,382 A | * | 8/1999 | Li et al. | 375/376 |
| 6,043,715 A | * | 3/2000 | Bailey et al. | 331/2 |
| 6,700,941 B1 | * | 3/2004 | Nagao | 375/327 |
| 6,859,079 B2 | * | 2/2005 | Haraguchi et al. | 327/156 |
| 7,558,311 B2 | * | 7/2009 | Shin et al. | 375/130 |
| 7,965,115 B2 | * | 6/2011 | Jin | 327/147 |

* cited by examiner

*Primary Examiner* — Levi Gannon

(74) *Attorney, Agent, or Firm* — McClure, Qualey & Rodack, LLP

(57) ABSTRACT

A reference assisted control system and method thereof are disclosed. The method comprises: receiving a first input signal and a second control signal; generating a first intermediate signal in accordance with a difference between the first input signal and the first output signal; filtering the second control signal to generate a second intermediate signal; performing a weighted sum of the first intermediate signal and the second intermediate signal to generate the control signal; and outputting the first output signal in accordance with the control signal.

15 Claims, 4 Drawing Sheets

REFERENCE ASSISTED CONTROL SYSTEM AND METHOD THEREOF

FIELD OF TECHNOLOGY

This disclosure relates to control system.

BACKGROUND

As depicted in FIG. 1, a control system 100 comprises: a controller 110 for receiving an input signal IN and an output signal OUT and for generating a control signal CON in accordance with a difference between IN and OUT, and a controlled apparatus 120 for generating the output signal OUT in accordance with the control signal CON. The controller 110 adjusts the control signal CON in a closed-loop manner so as to make the output signal OUT tracks the input signal IN. The purpose of the control system 100 is to control the controlled apparatus 120 so that the output signal OUT tracks the input signal IN. A typical controller comprises: an error detector for generating an error signal representing a difference between the input signal IN and the output signal OUT, and a filter for filtering the error signal into the control signal CON. In a practical embodiment, the control signal CON usually contains a noise component. If, due to constraints in practical embodiments, the controlled apparatus 120 is very sensitive to the control signal CON, the output signal OUT may be very noisy because it may overreact to the noise component.

What is needed is a method and apparatus for reducing sensitivity to noise for a control system that comprises a very sensitive controlled apparatus.

BRIEF SUMMARY OF THIS INVENTION

In an embodiment, an apparatus is disclosed, the apparatus comprising: a controller for receiving a first input signal and a first output signal and generating a first intermediate signal in accordance with a difference between the first input signal and the first output signal; a low-pass filter for receiving a second control signal and outputting a second intermediate signal; a weighted sum circuit for performing a weighted sum on the first intermediate signal and the second intermediate signal to generate a first control signal; and a controlled circuit for generating the first output signal in accordance with the first control signal, wherein an average value of the second control signal is approximately equal to an average value of the first control signal in a steady state of operation.

In an embodiment, an apparatus is disclosed, the apparatus comprising: a second circuit for outputting a second control signal; and a first circuit for receiving a first input signal and the second control signal and outputting a first output signal such that the first output signal tracks the first input signal in a closed-loop manner via establishing a first control signal that controls the first output signal based on a weighted combination of detecting a difference between the first input signal and the first output signal and filtering the second control signal.

In an embodiment a method is disclosed, the method for generating a first output signal, the method comprising: receiving a first input signal and a second control signal; generating a first intermediate signal in accordance with a difference between the first input signal and the first output signal; filtering the second control signal to generate a second intermediate signal; performing a weighted sum of the first intermediate signal and the second intermediate signal to generate the control signal; and outputting the first output signal in accordance with the control signal.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 1:
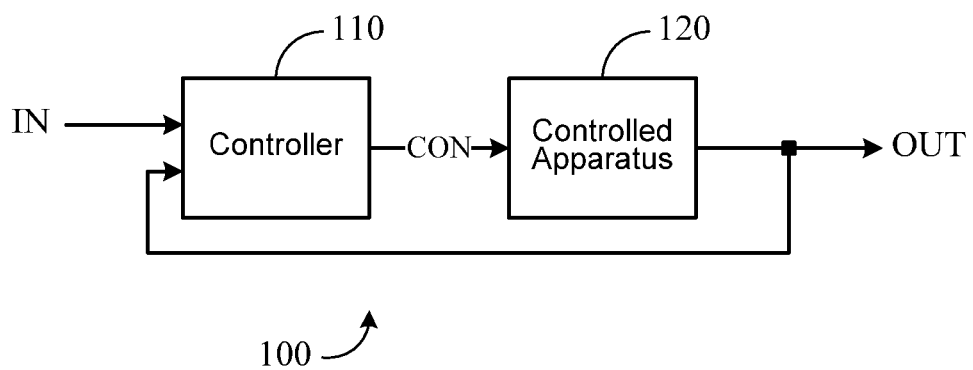
FIG. 1 shows a functional block diagram of a control system.
Figure 2:
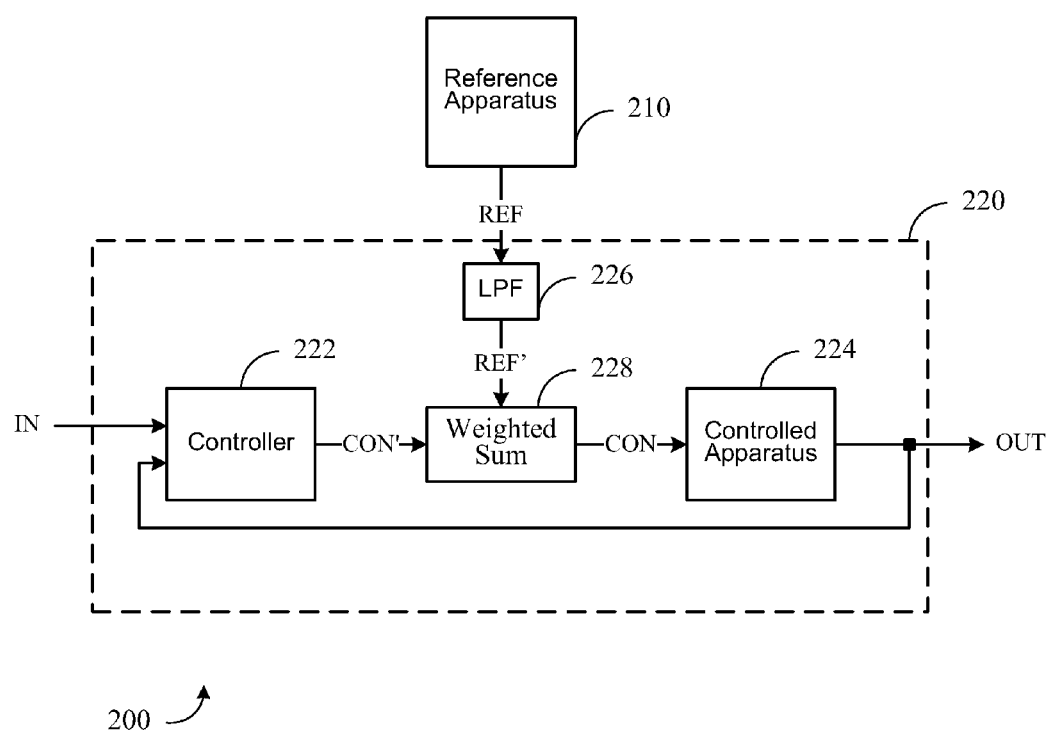
FIG. 2 shows a functional block diagram of an embodiment comprising a reference apparatus and a control system.

FIG. 2 shows a functional block diagram of an embodiment 200 in accordance with the present invention. Embodiment 200 comprises: a reference apparatus 210 for outputting a reference signal REF, and a control system 220 for receiving an input signal IN and the reference signal REF and for outputting an output signal OUT. Control system 220 comprises: a controller 222 for generating a first intermediate signal CON' in accordance with a difference between the input signal IN and the output signal OUT, a low-pass filter (LPF) 226 for filtering the reference signal REF into a second intermediate signal REF', a weighted sum functional block 228 for performing a weighted sum of the first intermediate signal CON' and the second intermediate signal REF' to generate a control signal CON, and a controlled apparatus 224 for generating the output signal OUT in accordance with the control signal CON. In a preferred embodiment, the weighted sum functional block 228 can be mathematically modeled as performing the following function:

$$CON' = \alpha \cdot CON' + (1-\alpha) \cdot REF', \text{ where } \alpha \text{ is a number greater than 0 but smaller than 1}$$

In a steady state, the control signal CON is adapted in a closed-loop manner so as to make the output signal OUT tracks the input signal IN, as is in the case of any feedback control system. However, the control system 220 adapts the control signal CON by adapting the first intermediate signal CON' but not the second intermediate signal REF', because the second intermediate signal REF' originates from the reference apparatus 210 and beyond the controllability of the control system 220. The second intermediate signal REF' is generated by low-pass filtering the reference signal REF using the low-pass filter 226. In a preferred embodiment, the low-pass filter 226 has a cut-off frequency that is substantially lower than a bandwidth of the control system 220 and therefore the second intermediate signal REF' appears substantially stationary, as far as the control system 220 is concerned. As long as the second intermediate signal REF' is approximately equal to a target steady state value of the control signal CON and the factor $(1-\alpha)$ is close to 1, the output signal OUT can roughly track the input signal IN due to the second intermediate signal REF', and a residual error between the input signal IN and the output signal OUT is corrected by the control system 220 by adapting the first intermediate signal CON'. In this manner, one can greatly reduce sensitivity to noise for control system 220, because the adaptation of the control signal CON by the controller 222 by adapting the first intermediate signal CON' is weighted by the factor α, which is small when the factor (1−α) is close to 1. This reduction is particularly useful when the controlled apparatus 224 is very sensitive to the control signal CON. By way of example but not limitation, α is 0.1 and the sensitivity to the noise of the controller 222 is reduced by a factor of 90%.

Figure 3:
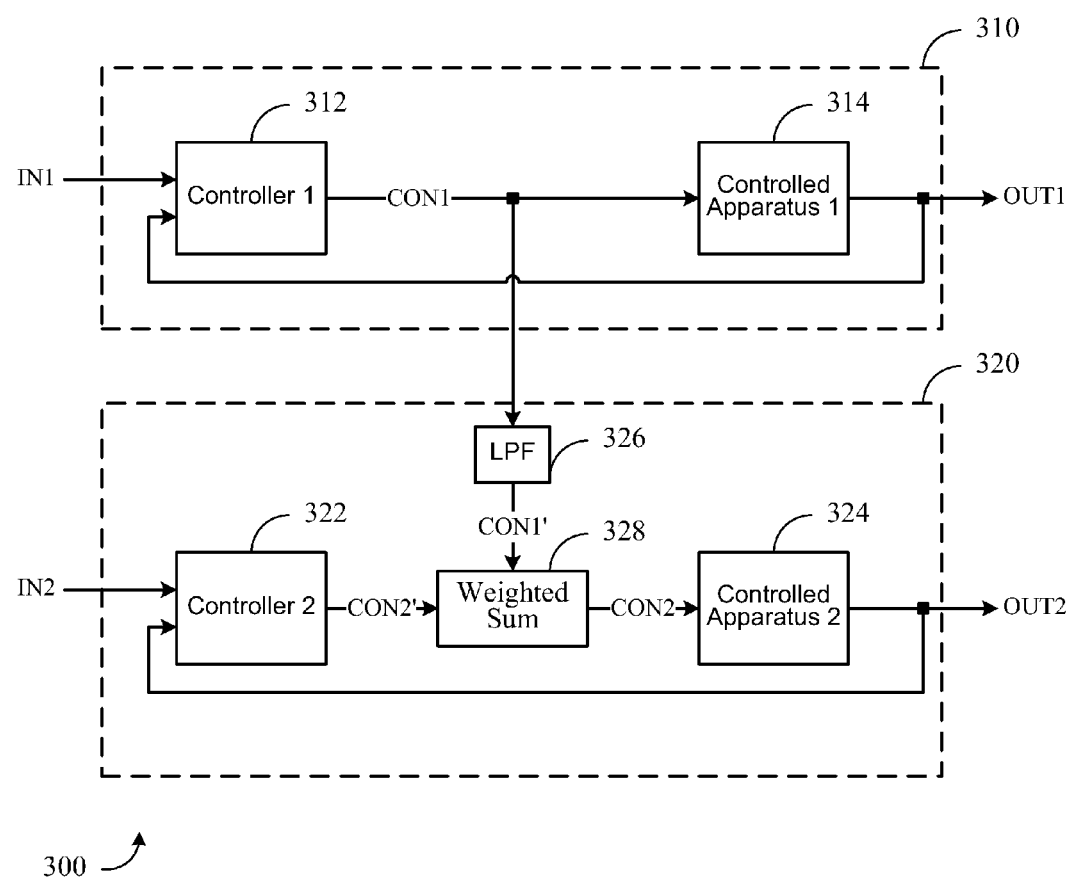
FIG. 3 shows a functional block diagram of an embodiment comprising two control systems.

This present disclosure is useful for applications where two control systems are needed and the two control systems utilize substantially similar controlled apparatuses generating substantially similar output signals. In this case, one control system can serve as a reference apparatus for the other control system. FIG. 3 shows a functional block diagram of an embodiment 300 in accordance with the present invention for this case. Embodiment 300 comprises a first control system 310 for receiving a first input signal IN1 and outputting a first output signal OUT1 and first control signal CON1, and a second control system 320 for receiving a second input signal IN2 and the first control signal CON1 and outputting a second output signal OUT2. The first control system 310 comprises: a first controller 312 for generating a first control signal CON1 in accordance with a difference between the first input signal IN1 and the first output signal OUT1, and a first controlled apparatus 314 for generating the first output signal OUT1 in accordance with the first control signal CON1. The second control system 320 comprises: a second controller 322 for generating a first intermediate signal CON2' in accordance with a difference between the second input signal IN2 and the second output signal OUT2, a low-pass filter (LPF) 326 for filtering the first control signal CON1 into a second intermediate signal CON1', a weighted sum functional block 328 for performing a weighted sum of the first intermediate signal CON2' and the second intermediate signal CON1' to generate a second control signal CON2, and a second controlled apparatus 324 for generating the second output signal OUT2 in accordance with the second control signal CON2. In a preferred embodiment, the weighted sum functional block 328 can be mathematically modeled as performing the following function:

$$CON2=\alpha \cdot CON2'+(1-\alpha)\cdot CON1', \text{ where } \alpha \text{ is a number greater than 0 but smaller than 1}$$

Controlled apparatuses 314 and 324 are substantially similar and output signals OUT1 and OUT2 are also substantially similar, therefore the two control signals CON1 and CON2 are substantially similar in a steady state of interest. In the steady state, the second intermediate signal CON1', which is generated by low-pass filtering the first control signal CON1 using the low-pass filter 326, serves as a good estimate for the second control signal CON2. A residual error between the second input signal IN2 and the second output signal OUT2 is corrected by the second control system 320 by adapting the first intermediate signal CON2' using the second controller 322. A cut-off frequency of the low-pass filter 326 is substantially lower than a bandwidth of the second control system 320 such that the second intermediate signal appears substantially stationary when the second control system 320 adjusts the first intermediate signal. Therefore, sensitivity to the noise of the controller 322 can be reduced due to using the weighted sum function instead of directly using the first intermediate signal CON2'.

A control system of interest is PLL (phase lock loop). A typical PLL receives an input signal, which is either an input clock or an input binary data stream, and outputs an output signal, which is an output clock that is generated by a VCO (voltage controlled oscillator) under control by a control voltage. The control voltage is adjusted in a closed-loop manner so as to make the output signal track a timing of the input signal. The control voltage is generated by a PLL controller comprising a phase detector followed by a loop filter, wherein the phase detector outputs an error signal representing a timing difference between the input signal and the output signal and the error signal is then filtered by the loop filter to generate the control voltage for controlling the VCO. The principle and embodiment of a PLL are well known to those of ordinary skill in the art and thus not described in detail here. This present invention is useful for a PLL whose VCO is very sensitive to the control voltage. An embodiment 400 is depicted in FIG. 4 to illustrate an application of the present invention to PLL.

Figure 4:
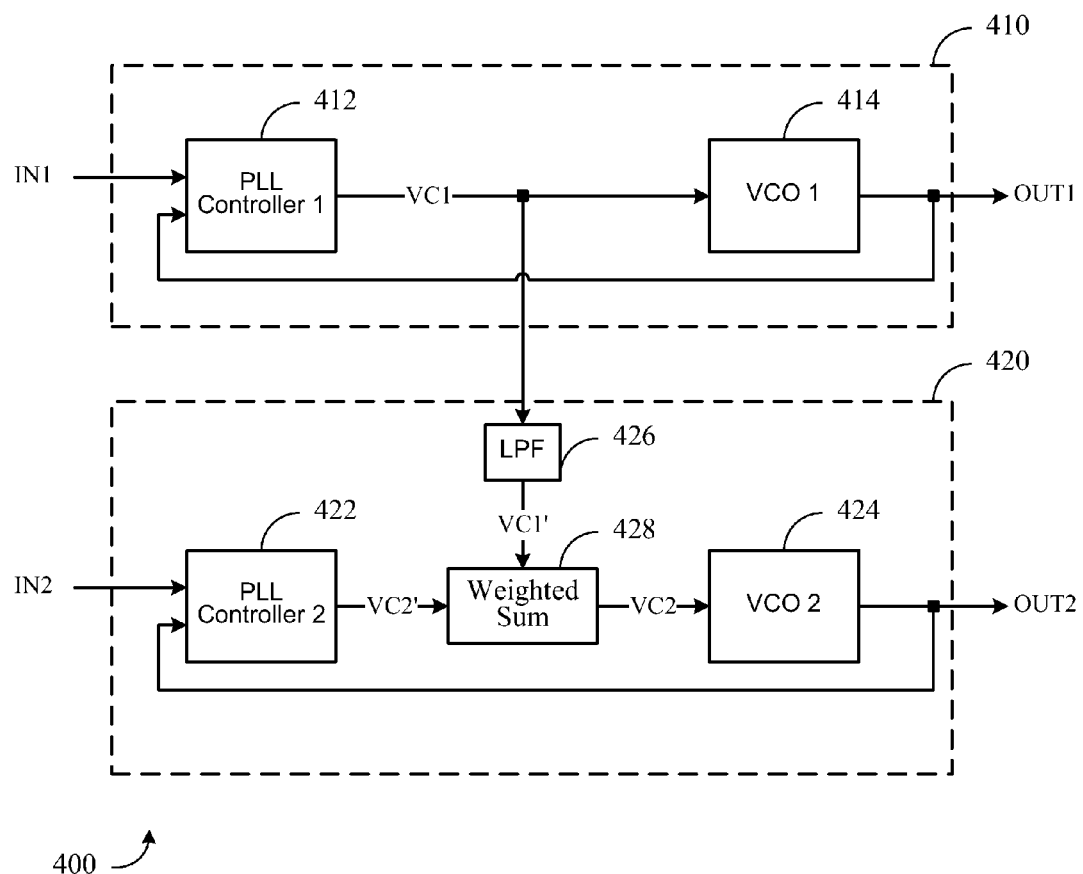
FIG. 4 shows a functional block diagram of an embodiment comprising two phase lock loops.

Embodiment 400 of FIG. 4 comprises a first PLL 410 for receiving a first input signal IN1 and outputting a first output signal OUT1 and a first control voltage VC1, and a second PLL 420 for receiving a second input signal IN2 and the first control voltage VC1 and outputting a second output signal OUT2. The first PLL 410 comprises: a first PLL controller 412 for generating a first control voltage VC1 in accordance with a timing difference between the first input signal IN1 and the first output signal OUT1, and a first VCO 414 for generating the first output signal OUT1 in accordance with the first control voltage VC1. The second PLL 420 comprises: a second PLL controller 422 for generating a first intermediate signal VC2' in accordance with a timing difference between the second input signal IN2 and the second output signal OUT2, a low-pass filter (LPF) 426 for filtering the first voltage VC1 into a second intermediate signal VC1', a weighted sum functional block 428 for performing a weighted sum of the first intermediate signal VC2' and the second intermediate signal VC1' to generate a second control voltage VC2, and a second VCO 424 for generating the second output signal OUT2 in accordance with the second control voltage VC2. In a preferred embodiment, the weighted sum functional block 428 can be mathematically modeled as performing the following function:

$$VC2=\alpha \cdot VC2'+(1-\alpha)\cdot VC1', \text{ where } \alpha \text{ is a number greater than 0 but smaller than 1}$$

VCO 414 and 424 are substantially similar and output signals OUT1 and OUT2 are also substantially close in frequency, therefore the two control voltage VC1 and VC2 are substantially close. In a steady state, the second intermediate signal VC1', which is generated by low-pass filtering the first control voltage VC1 using the low-pass filter 426, serves as a good estimate for the second control voltage VC2. A residual timing error between the second input signal IN2 and the second output signal OUT2 is corrected by the second PLL 420 by adapting the first intermediate signal VC2' using the second PLL controller 422. Therefore, sensitivity to the noise of the second PLL controller 422 can be reduced due to using the weighted sum functional block 428 instead of directly using the first intermediate signal VC2' to control VCO 424.

Those of ordinary skill in the art may use alternative controlled oscillators, such as current controlled oscillators. A weighted sum functional block is well known to those of ordinary skill in the art and thus not described in detail here.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
    a controller for receiving a first input signal and a first output signal and generating a first intermediate signal in accordance with a difference between the first input signal and the first output signal;
    a low-pass filter for receiving a second control signal and outputting a second intermediate signal, wherein the second control signal is generated in accordance with a second input signal and a second output signal;
    a weighted sum circuit for performing a weighted sum on the first intermediate signal and the second intermediate signal to generate a first control signal; and
    a controlled circuit for generating the first output signal in accordance with the first control signal, wherein an average value of the second control signal is approximately equal to an average value of the first control signal in a steady state of operation.

2. The apparatus of claim 1, wherein the controller comprises:
    a phase detector for detecting a timing difference between the first input signal and the first output signal and outputting an error signal; and
    a loop filter for filtering the error signal into the first intermediate signal.

3. The apparatus of claim 2, wherein the controlled apparatus is a controlled oscillator.

4. The apparatus of claim 1, wherein the second intermediate signal is weighted substantially higher than the first intermediate signal in the weighted sum circuit.

5. The apparatus of claim 1, wherein the low-pass filter has a cut-off frequency that is substantially lower than at least one of bandwidths of the controller, the weighted sum circuit, and the controlled circuit.

6. The apparatus of claim 1, wherein the low-pass filter is sufficiently low in bandwidth such that the second intermediate signal appears substantially stationary when adjusting the first control signal.

7. An apparatus comprising:
    a second circuit for outputting a second control signal, wherein the second control signal is generated in accordance with a second input signal and a second output signal; and
    a first circuit for receiving a first input signal and the second control signal and outputting a first output signal such that the first output signal tracks the first input signal in a closed-loop manner via establishing a first control signal that controls the first output signal based on a weighted combination of detecting a difference between the first input signal and the first output signal and filtering the second control signal, wherein the first circuit comprises:
    a first phase detector for detecting the difference between the first input signal and the first output signal to generate a first intermediate signal;
    a low-pass filter for filtering the second control signal to generate a second intermediate signal;
    a weighted sum circuit for performing the weighted combination of the first intermediate signal and the second intermediate signal to generate the first control signal; and
    a first controlled oscillator for generating the first output signal, wherein the second intermediate signal is weighted substantially higher than the first intermediate signal in the weighted combination.

8. The apparatus of claim 7, wherein the second circuit is configured for receiving the second input signal and outputting the second output signal such that the second output signal tracks the second input signal in a closed-loop manner via establishing the second control signal that controls the second output signal based on detecting a difference between the second input signal and the second output signal.

9. The apparatus of claim 7, wherein the second circuit comprises:
    a second phase detector for detecting the difference between the second input signal and the second output signal to establish the second control signal; and
    a second controlled oscillator for generating the second output signal under control of the second control signal.

10. The apparatus of claim 9, wherein the first controlled oscillator is substantially similar to the second controlled oscillator.

11. A method for generating a first output signal, comprising:
    receiving a first input signal and a second control signal, wherein the second control signal is generated in accordance with a second input signal and a second output signal;
    generating a first intermediate signal in accordance with a difference between the first input signal and the first output signal;
    filtering the second control signal to generate a second intermediate signal;
    performing a weighted sum of the first intermediate signal and the second intermediate signal to generate a first control signal; and
    outputting the first output signal in accordance with the first control signal, wherein an average of the second control signal is substantially close to an average of the first control signal, and wherein the second intermediate signal is weighted substantially higher than the first intermediate signal in the weighted sum.

12. The method of claim 11, wherein the difference between the first input signal and the first output signal is a difference in timing.

13. The method of claim 12, wherein outputting the first output signal in accordance with the first control signal comprises generating the first output signal using a controlled oscillator under control of the first control signal.

14. The method of claim 11, further comprising:
    receiving the second input signal;
    outputting the second output signal in accordance with the second control signal;
    adjusting the second control signal in accordance with a difference between the second input signal and the second output signal such that the second output signal tracks the second input signal in a closed-loop manner.

15. The method of claim 11, wherein filtering the second control signal comprises filtering the second control signal with a low-pass filter with a low cut-off frequency such that the second intermediate signal appears substantially stationary when adjusting the first control signal.

* * * * *